(12) United States Patent
Basteres et al.

(10) Patent No.: US 6,456,183 B1
(45) Date of Patent: Sep. 24, 2002

(54) INDUCTOR FOR INTEGRATED CIRCUIT (75) Inventors: Laurent Basteres; Ahmed Mhani, both of Grenoble; François Valentin, Veurey Voroize; Jean-Michel Karam, Grenoble, all of (FR)

(73) Assignee: Memscap and Planhead-Silmag PHS (FR)

( * ) Notice: Subject to any disclaimer, the term of this patent is extended or adjusted under 35 U.S.C. 154(b) by 0 days.

(21) Appl. No.: 09/511,748

(22) Filed: Feb. 24, 2000

(30) Foreign Application Priority Data

Feb. 26, 1999 (FR) .............................................. 99 02658

(51) Int. Cl.[7] .............................................. H01F 2/00
(52) U.S. Cl. .................... 336/200; 336/223; 336/232
(58) Field of Search ................. 336/200, 223, 336/232

(56) References Cited

U.S. PATENT DOCUMENTS

| | | | |
|---|---|---|---|
| 3,858,138 A | | 12/1974 | Gittleman et al. |
| 3,881,244 A | | 5/1975 | Kendall |
| 5,070,317 A | | 12/1991 | Bhagat |
| 5,717,243 A | | 2/1998 | Lowther |
| 5,788,854 A | * | 8/1998 | Desaigoudar et al. .......... 216/13 |
| 5,900,797 A | * | 5/1999 | Dougauchi ................... 336/200 |

FOREIGN PATENT DOCUMENTS

EP 413348 A2 8/1990

* cited by examiner

*Primary Examiner*—Anh Mai
(74) *Attorney, Agent, or Firm*—Wall Marjama & Bilinski LLP (57) ABSTRACT

An inductor assembly for use in RF and microwave circuits wherein the inductor is formed of a first spiral wound metal strip that is mounted on a flat surface of a quartz substrate. The metal strip is formed of copper and has a height above the flat surface that is about 30 microns.

10 Claims, 6 Drawing Sheets

INDUCTOR FOR INTEGRATED CIRCUIT

TECHNICAL FIELD

The invention relates to the field of microelectronics and microsystems. It relates more specifically to a novel design of inductive components or integrated transformers which are intended to be associated with integrated circuits, such as those used especially in the radiofrequency field.

The purpose of the invention is more specifically to obtain inductors having a better Q-factor right from low frequencies and operating at higher frequencies than with inductors currently obtained.

PRIOR ART

As is known, integrated circuits are being used increasingly in the microwave and radiofrequency fields.

In these applications, it is important to be able to use tuned oscillating circuits consisting of a capacitor-inductor combination. However, these circuits must be produced so as to occupy increasingly smaller volumes. Furthermore, they must operate at increasingly higher frequencies.

Finally, the electrical consumption of such components is becoming a critical parameter, for example in cellular portable telephones, since this consumption has a direct influence on the autonomy of these appliances.

Thus, the passive components forming the filters used in radiofrequency systems, especially the inductors, are required to occupy as small as possible an area within the integrated circuits, with this inductor having as high an inductance as possible, and to result in as low as possible an electrical consumption.

Furthermore, it is known that the inductors fitted into integrated circuits made of semiconductor material are exposed to the influence of parasitic capacitances formed by the various localized substrate regions in the vicinity of the inductors.

Figure 1:
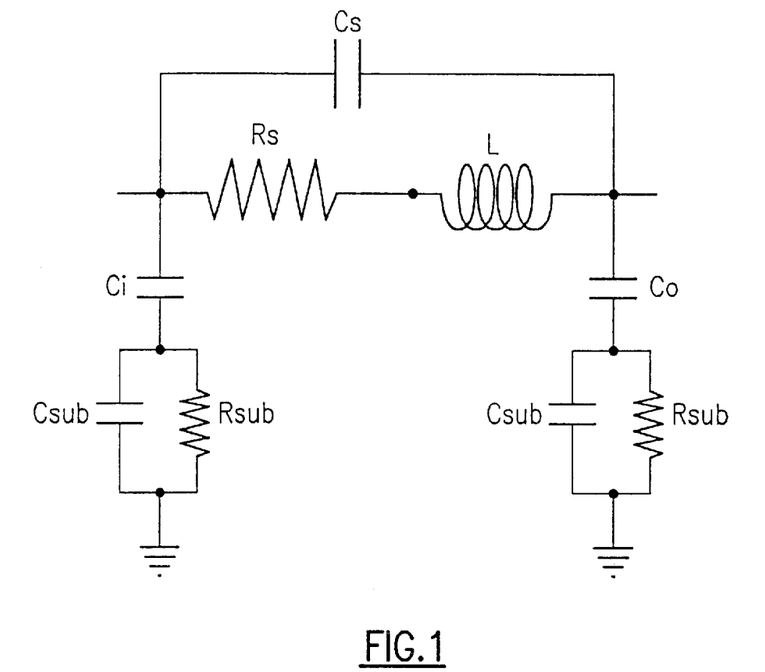
FIG. 1 is an electrical circuit diagram modeling the behavior of an inductor mounted on a substrate.

FIG. 1 shows an equivalent circuit for an inductor implanted in an integrated-circuit chip.

Thus, such an inductor has an equivalent circuit in which, added to the actual inductor (L), there are the various parasitic components which make this inductor depart from its ideal behavior.

Thus, an inductor has a resistance ($R_s$) corresponding to that of the metal of which it is composed. Furthermore, this inductor has various capacitances (represented by the capacitors $C_i$ and $C_o$) which are parasitic capacitances resulting from the presence of the oxide layer deposited on top of the substrate. Furthermore, this inductor includes, in series with said capacitors $C_o$ and $C_i$, a capacitor $C_{sub}$ and a resistor $R_{sub}$ in parallel, corresponding to the influence of the semiconductor substrate located between said oxide layer and the ground plane.

Moreover, a certain parasitic capacitance exists between the various turns making up the inductor and is modeled in the equivalent circuit in FIG. 1 by the capacitor ($C_s$).

The Applicant, in French Patent Application FR 98/08434, which at the date of filing of the present application has not yet been published, has described a solution allowing such inductors to be produced on a semiconductor substrate by adopting an arrangement allowing the capacitance of the interturn parasitic capacitor ($C_s$) to be greatly reduced. By virtue of such a solution it is possible to use such an inductor at higher frequencies, while still retaining satisfactory behavior.

It will be recalled that the optimum operating frequency is defined as being that for which the Q-factor is a maximum. The Q-factor is defined in a known manner by the ratio of the imaginary part or reactants to the real part of the input inductance corresponding to the model illustrated in FIG. 1.

The solution described in the aforementioned document, although satisfactory, does not allow the Q-factor to be significantly improved in the low-frequency ranges, that is to say those lying below half the optimum frequency, which is typically close to a few gigahertz in the radiofrequency applications of the invention.

This is because, in this frequency range, the behavior of the inductor is strongly dependent on the value ($R_s$) of the resistor, which corresponds to the electrical resistance of the metal strip from which the actual inductor is composed.

However, all the inductors produced in circuits, even integrated circuits, are made at the present time of aluminum, and are small in size having especially a very small thickness, thereby resulting in a high electrical resistance.

Thus, one of the problems that the invention aims to solve is that of the undesirable influence of the overall resistance of the winding forming the inductor.

SUMMARY OF THE INVENTION

The invention therefore relates to an inductive component, especially:

a substrate layer;

a flat inductor formed from a metal strip wound in a spiral.

The inductive component according to the invention is one wherein, on the one hand, the substrate layer is made of quartz and wherein, on the other hand, the metal strip is made of copper and has a thickness of greater than 10 microns.

In this way, the value of the resistance of the winding is very greatly reduced by using a conductive material much less resistive than the aluminum used in the prior art.

Furthermore, the chosen dimensional parameters, especially the thickness of the strip of which the turns are composed, also very greatly reduce the overall value of the resistance of the winding.

This reduction in the resistance is accomplished while retaining an extremely tiny parasitic capacitance ($C_s$) by virtue of the implantation of the metal strip on a substrate made of quartz, the dielectric properties of which are quite close to those of air.

By virtue of the characteristics of the inductor according to the invention, it has been observed that the Q-factor was ten times greater than that observed with an inductor of the same inductance but produced according to the prior art.

By way of example, for an inductance of about 5 nanohenries (nH) and for a typical frequency of 1.8 gigahertz (GHz), the Q-factor is about 40 whereas with the prior technologies it was close to 4.

In practice, it has been found that the results are very satisfactory when the thickness of the metal strip is about 30 microns.

According to one feature of the invention, the space between the opposing faces of two adjacent turns is free of material.

Consequently, the presence of air, which has a very low electrical permitivity, greatly limits the interturn parasitic capacitances which have been seen to have a negative impact on the optimum use of integrated inductors.

In one embodiment, the inductive component according to the invention furthermore includes a polyimide layer interposed between the inductor and the quartz substrate, within which polyimide layer that segment of the strip which connects the center of the spiral passes, and the end of the strip forming a connection terminal.

In practice, the metal strip is advantageously covered with a layer of gold on its faces other than those in contact with the substrate or the polyimide layer.

Thus, the risks of oxidation, inherent in the operation of the component according to the invention in a chemically aggressive environment, such as especially a wet, or indeed maritime, atmosphere, are overcome by protecting the conducting strip from the oxidation phenomena which would degrade the overall resistance of the strip.

The aforementioned aspects of the invention may also apply to the production of integrated transformers. Thus, such a transformer includes two flat inductors according to the invention, formed by two metal strips wound in spirals, said spirals being wound in each other so that the turns of one of the inductors are positioned between the turns of the other inductor.

In order to obtain high inductances, while still retaining a satisfactory Q-factor, in practice the strip is advantageously wound in two spirals in series, the two spirals being parallel to each other, the spiral closer to the substrate being embedded in a polyimide layer.

Consequently, by virtue of the magnetic coupling phenomena, the inductance is more than twice the inductance of an inductor formed from a single spiral. The overall size of such an inductor is therefore reduced. Furthermore, for a given inductance, two spirals are used, each having a resistance less than half of that of a single inductor, something which proves to be advantageous with regard to the Q-factor.

In one particular embodiment, intended for applications in particularly aggressive media, the polyimide layer in which the second spiral is embedded may be covered with a barrier layer made of silica. Consequently, the lifetime of such a component may be extended.

In one particular embodiment, the inductor according to the invention is such that the two ends of the strip form connection terminals on which spacer elements or "bumps" having a height close to the thickness of the metal strip are mounted.

Consequently, such an inductor, or its transposition into the transformer, has elements making it easier for it to be fitted onto an integrated circuit.

The invention also relates to an integrated circuit associated with an aforementioned inductive component or integrated transformer.

According to one feature of the invention, such an integrated circuit comprises connection leads for the inductive component or for the integrated transformer and it is characterized in that:

the substrate used is made of quartz;

the metal strips are made of copper and have a thickness of greater than 10 microns.

In other words, the inductive component or the transformer are mounted using a technique known as "flip-chip".

In practice, the spacer elements, usually called "bumps", are advantageously chosen so that they have a height close to the thickness of the strip of the inductive component.

Consequently, the strip forming the inductor is separated from the semiconductor substrate of the integrated circuit by a distance which ensures that the inductive component on the integrated circuit is mechanically stable, while limiting the influence of the parasitic conductivity of the semiconductor substrate on the behavior of the inductor.

This is because it has been observed that if the height of the spacer elements is too great, typically greater than the thickness of the strip, this then results in a risk of mechanical instability which may lead, in the case of shocks, to the connection between the integrated circuit and the inductor being broken.

Conversely, when the distance between the semiconductor substrate of the integrated circuit and the inductor is too small, phenomena of electrical loss through the semiconductor are observed, which reduce the performance of the latter.

Thus, in practice, good results are obtained with 30 micron spacers or "bumps" for a strip thickness of about 30 microns.

In practice, in order to further improve the stability of the inductive component mounted on the integrated circuit, the spacer elements are advantageously in the form of a cylinder which preferably has a diameter close to three times its height.

BRIEF DESCRIPTION OF THE FIGURES

The manner in which the invention is realized and the advantages which stem therefrom will become clearly apparent from the description of the following embodiments, supported by the appended figures in which.

As already stated, the invention relates firstly to an inductive component intended to be used in association with an integrated circuit, in radiofrequency or microwave applications.

Figure 2:
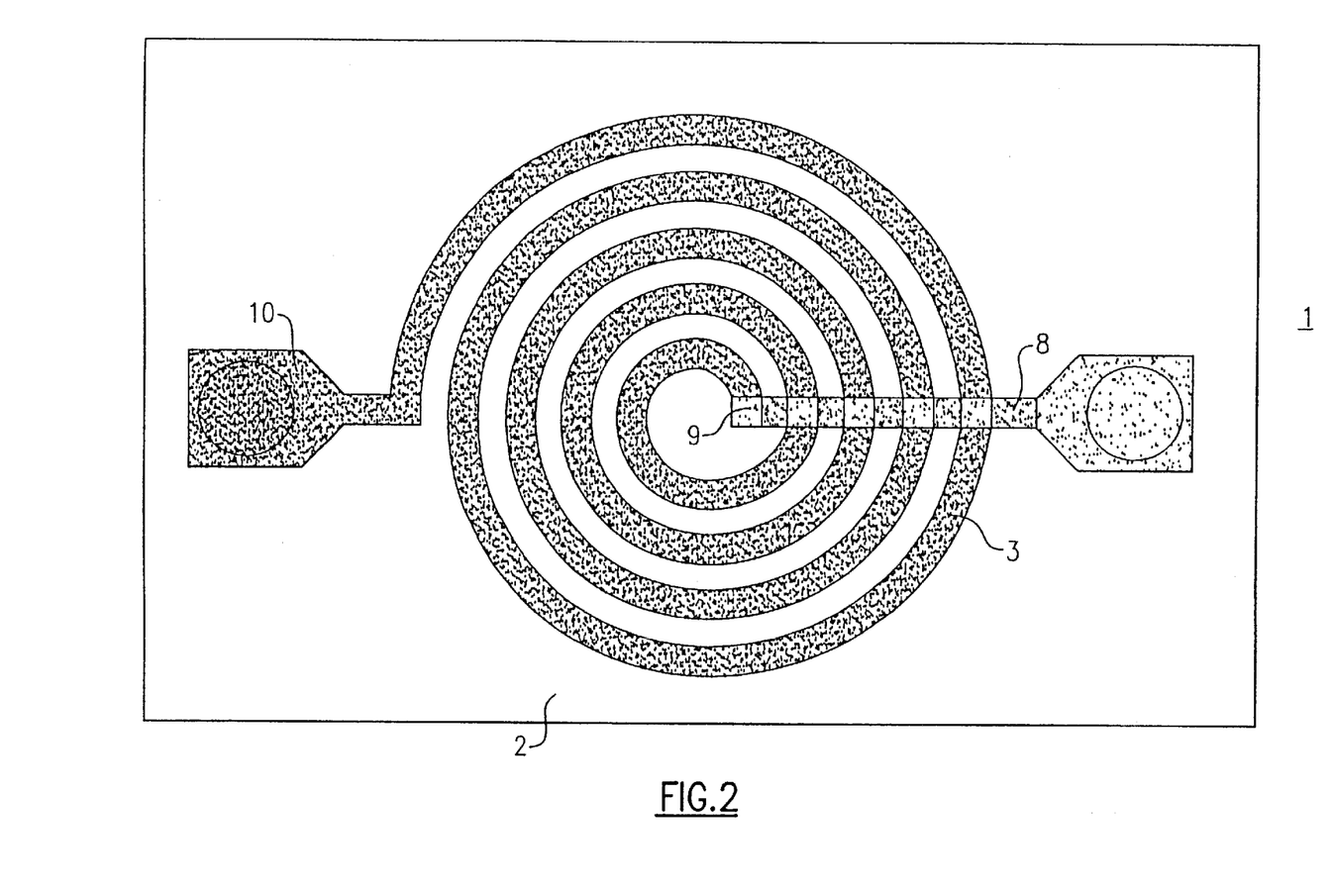
FIG. 2 is a top view of an inductive component according to the invention.

According to one feature of the invention, this inductive component (1), as illustrated in FIG. 2, essentially comprises a substrate plate (2), made of quartz, on which a winding consisting of a metal strip (3) is placed.

This strip (3) is wound in a spiral so as to form an inductive coil. The shape illustrated in FIG. 2 is a winding in a circular spiral, which is the preferred geometry, but the invention is not limited to this type of winding and encompasses other spiraled windings in which the strip consists, for example, of a succession of straight segments each making an angle of 90° with the following segment in order to give the winding an overall square shape. Other polygonal shapes may also be envisaged.

According to an important feature of the invention, the substrate used is made of quartz.

According to another important feature of the invention, the strip forming the inductor is made of copper and has a thickness much greater than that of the strips used to form the existing integrated inductors.

Thus, the strip (3) has a thickness ($E_3$) of greater than 10 microns, and preferably close to 30 microns, values to be compared with the 2 to 3 microns for the thickness of the aluminum strips of existing inductors.

Figure 3:
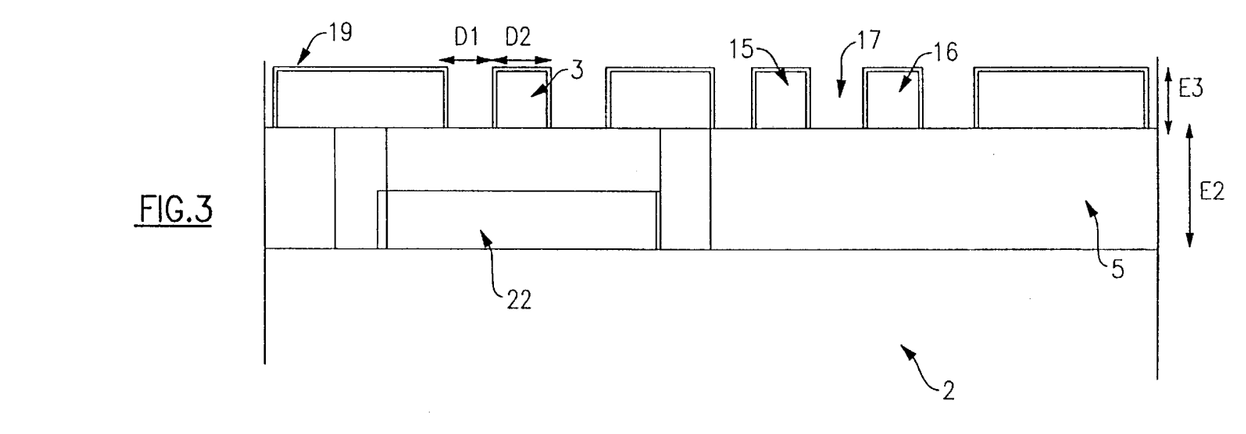
FIG. 3 is a cross-sectional view of a component according to the invention, using a strip forming a single spiral.

More specifically, and as illustrated in FIG. 3, the quartz substrate layer is covered with a polyimide layer (5) placed between the quartz substrate (2) and the strip (3) forming the inductor.

In particular, passing through this polyimide layer is the segment (8) which connects the center (9) of the spiral to the end (10) of the strip, which forms one of the two connection terminals.

In practice, the thickness ($E_2$) of the polyimide layer (5) is about 35 microns. The thickness of the polyimide layer which covers the segment (8) is between 4 and 6 microns.

As illustrated in FIG. 3, the width (D2) of each turn (10) is about 30 microns, while the distance (D1) separating the copper turns (15) is about 30 microns.

Depending on the value of inductance desired, a spiral having the appropriate number of turns is produced.

As already stated, according to one of the features of the invention, the copper strip (3) is covered, on its faces in contact with the external medium, with a thin gold layer (19), typically having a thickness of 1000 to 2000 Å, the function of the gold layer being to protect the copper strip (3) from oxidation phenomena which, as is known, degrade the conducting properties of copper.

According to one feature of the invention, the space (17) lying between the turns (15, 16) of the strip is free of any material, and is therefore filled with air. Thus, the parasitic capacitance existing between turns (15, 16) is reduced as far as possible, thereby allowing the inductor to operate over a greater frequency range.

Figure 4:
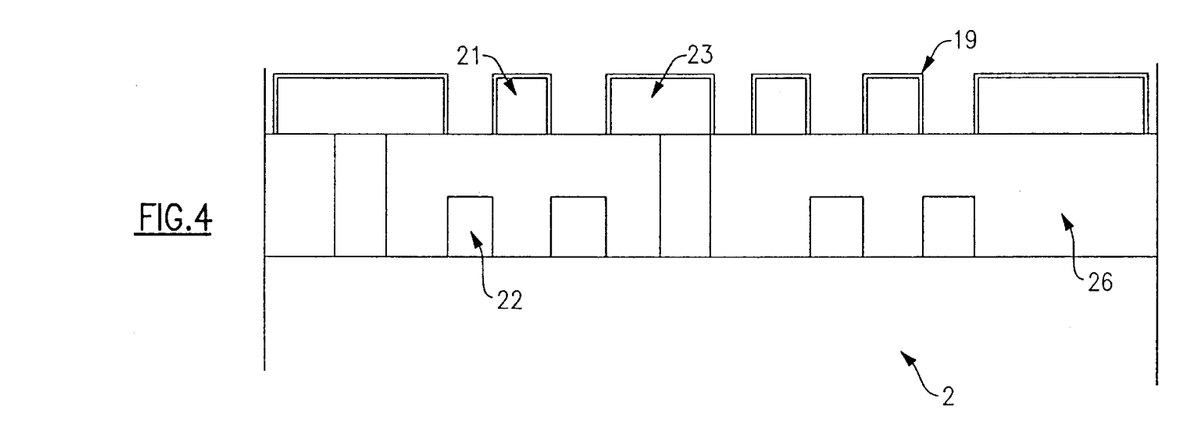
FIGS. 4 and 5 are partial sectional views illustrating embodiments in which the inductor is formed by two parallel spirals.

If a high inductance is sought, the copper strip is wound so as to form two spirals in series, as illustrated in the cross section in FIG. 4.

More specifically, the strip forms two flat spirals (21, 22) placed so as to be parallel to each other.

These two spirals (21, 22) are connected in series at their common central axis (23) and rotate in the same direction.

Thus, as illustrated in FIG. 4, the spiral (22) placed closer to the quartz substrate (2) is embedded in the polyimide layer (26) while the spiral (21) is in contact with the external medium and, like the single spiral in FIG. 3, is covered with a gold layer (19) intended to prevent the risk of oxidation.

The cross section of the turns is identical in both spirals. In the particular case in which the spirals are polygonal, it is advantageous for the turns of the two spirals to be offset transversely so that the turns are not on top of each other, thereby reducing the interturn parasitic capacitance.

Figure 5:
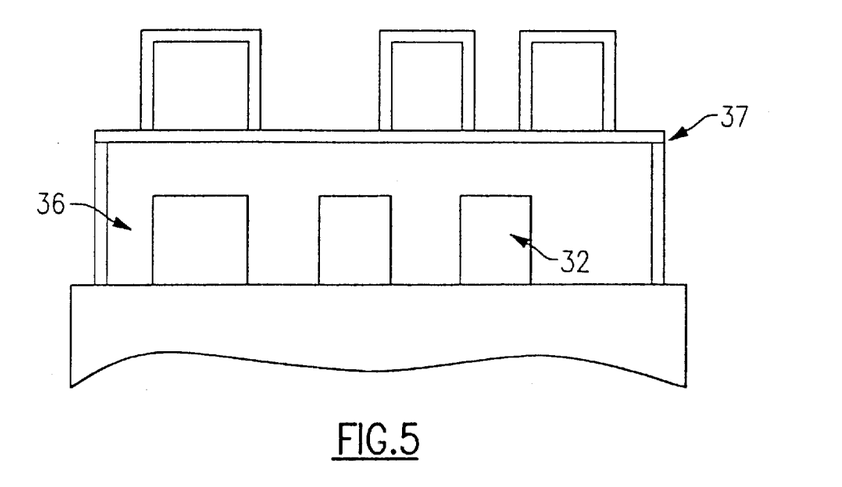

In one particular embodiment illustrated in FIG. 5, the polyimide layer (36) within which the lower spiral (32) is immersed is itself covered with a protective silica layer (37) intended to protect the polyimide layer (36) from external chemical attack and thus to extend the lifetime of the inductive component.

Figure 6:
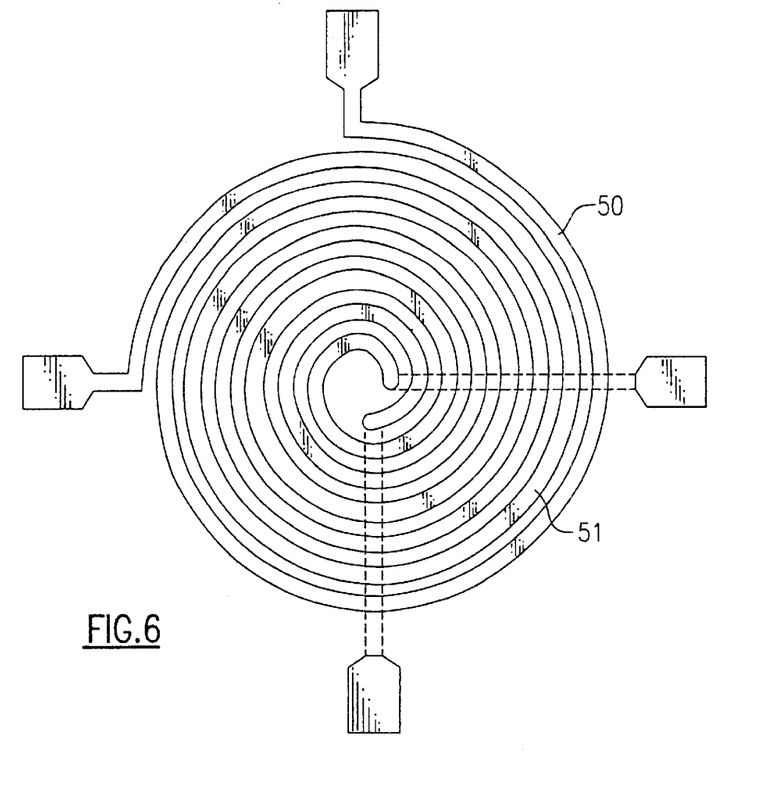
FIG. 6 is a top view of an integrated transformer according to the invention, which includes two windings.

The principle of the invention also allows the production of integrated transformers which, according to FIG. 6, include at least two inductors (50, 51) formed by two independent strips and wound in imbricated spirals in such a way that these inductors (50, 51) are coupled.

Figure 7:
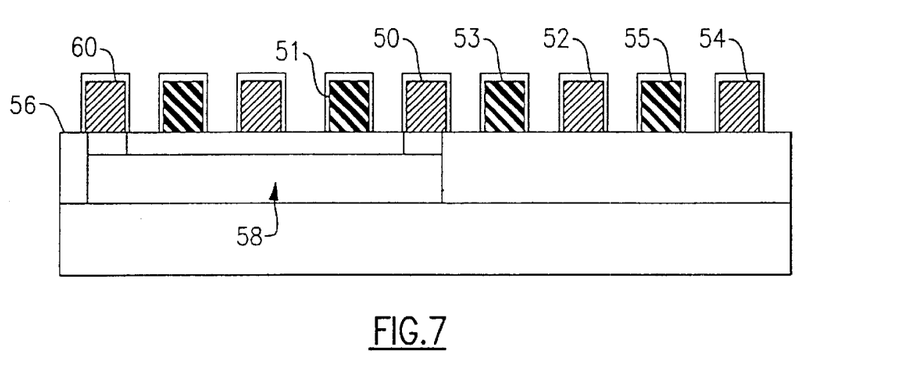
FIG. 7 is a cross-sectional view of a transformer produced according to the invention.

In practice, as illustrated in FIG. 7, the inductors (50, 51) are wound in such a way that the turns (53, 55) of a first spiral (51) are inserted between the turns (52, 54) of the other spiral (50).

As already stated, the inductive component according to the invention is intended to be incorporated into a radiofrequency circuit, especially one incorporating integrated circuits.

Figure 8:
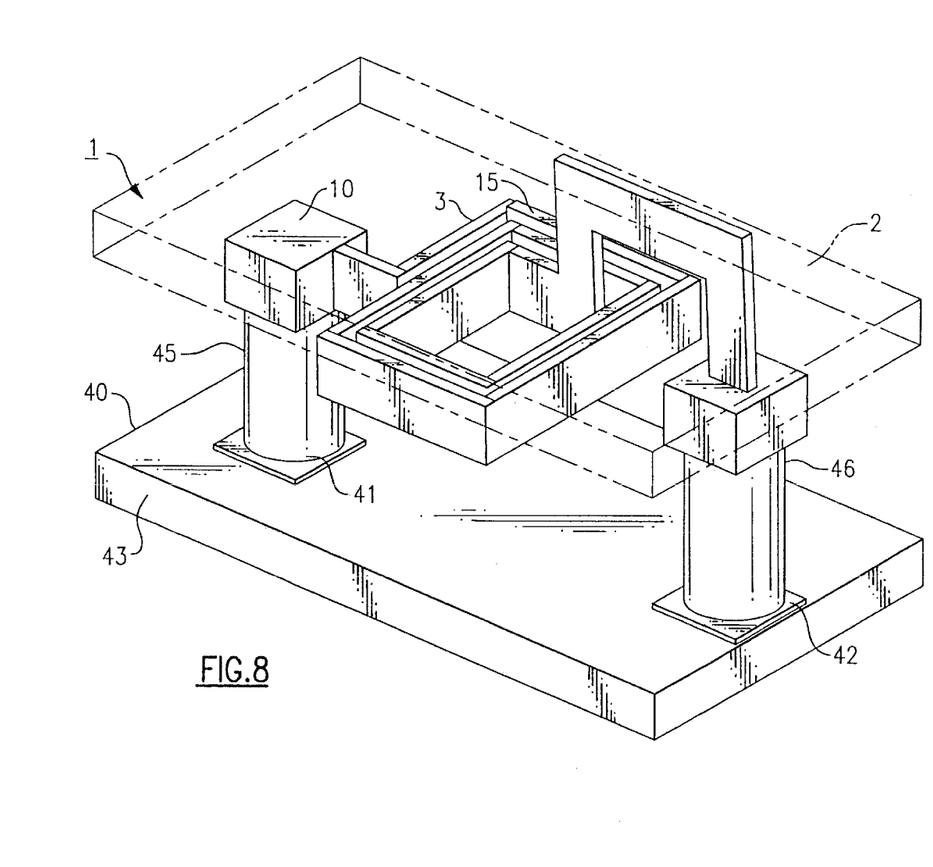
FIG. 8 is a simplified explanatory diagram showing the association of an inductive component according to the invention on an integrated circuit.

Such an association is especially illustrated, schematically, in FIG. 8.

Thus, the aforementioned inductive component (1) is mounted, using a mounting technique commonly called "flip-chip", on an integrated circuit (40), which comprises metal contact pads (41, 42) provided within the passivation layer (43) of the semiconductor substrate, by means of spacer elements (45, 46) which are generally called "bumps".

In FIG. 8, the quartz substrate (2) of the inductive component (1) has been made transparent in order to reveal the strip (3) forming the inductor, which strip lies between the integrated circuit (40) and the quartz substrate (2).

According to one feature of the invention, this mounting is effected by means of spacers (45, 46) which have a cylindrical cross section intended especially to ensure good mechanical stability of the inductive component (1) on the integrated circuit (40).

This is because it is known that radiofrequency circuits have to withstand particularly high mechanical vibration/shock stresses.

Thus, for example in the application of the invention to portable telephones, the equipment is subjected to very rigorous impact tests in which accelerations of several g may be reached. It is therefore essential that the components mounted on top of the integrated circuits are not exposed to any risk of debonding, which would have the consequence of an appliance being taken out of service. The vibration stresses are also very severe.

Thus, according to one feature of the invention, the spacer elements (45, 46) have a particularly robust cylindrical shape. The diameter chosen for such cylindrical spacer elements is substantially similar to the width of a standard contact pad (41, 42) produced on an integrated circuit, namely of the order of 100 microns.

Consequently, this arrangement ensures that there is very good mechanical stability and the electrical resistance of such a spacer element (45, 46) is negligible.

The height of the spacer element is chosen to be very close to the height of the turns (15) of the copper strip (3) and is typically about 30 microns. Attachment to the integrated circuit takes place by soldering.

A height of the spacer element (45, 46) of 30 microns makes it possible to ensure a good compromise between the mechanical stability of the inductive component (1) on the integrated circuit (40), while limiting as far as possible the electrical loss phenomena within the semiconductor substrate that too close a proximity would create.

The production of the copper strip is carried out using a process which incorporates an electro-deposition step. This electrodeposition takes place by growth on a base line formed on the outer face by a metal growth layer covered with a photosensitive resin, which is exposed and developed to the form of the pattern.

Large turn heights are obtained since the side walls of the heat-sensitive resin form blocks which occupy the volume that will constitute, after electrolytic growth of the copper, the interturn space.

Thus, the electrolytic growth of the copper is channeled laterally, making it possible to obtain copper turns of almost rectangular cross section and of large height.

After the step of producing the turns by electrolytic growth, the material that had served as a block is removed in order to obtain, according to one feature of the invention, an interturn space filled with air. The aforementioned metal growth layer is also removed.

Figure 9:
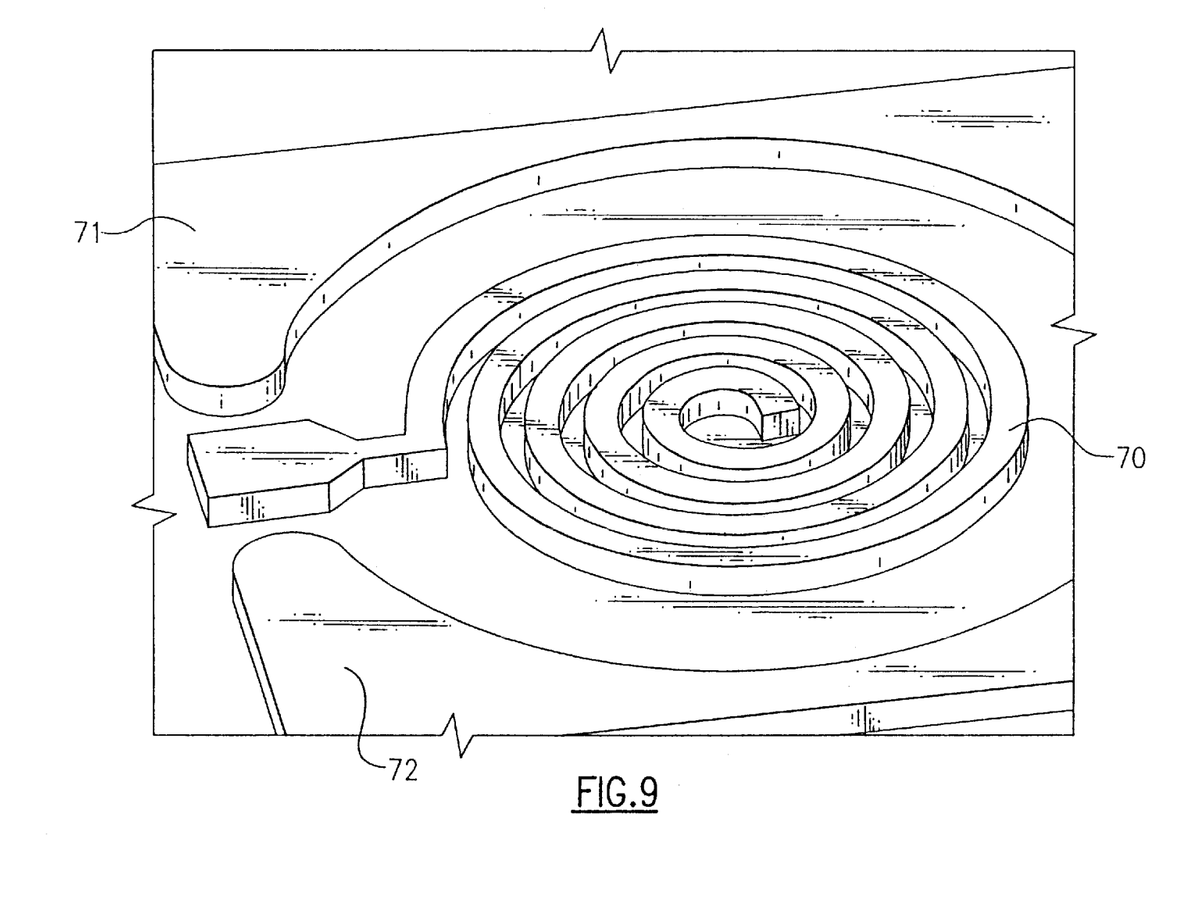
FIG. 9 is the reproduction of a photograph, taken in an electron microscope, of a metal strip used in an inductive component according to the invention.

FIG. 9 is a photograph, taken in an electron microscope, which shows a strip (70) produced according to the aforementioned process. It is surrounded by two pieces (71, 72), also made of metal, which play no role in the inductive behavior of the component.

It is apparent from the foregoing that the inductive component, as well as the transformer according to the invention, has many advantages, especially an excellent Q-factor which is greater by a factor of about 10 than that of inductors produced according to the techniques known to date. Furthermore, the operating frequency range is high since the interturn parasitic capacitance is particularly low.

Moreover, the resistance to chemically aggressive atmospheres is very good.

When associated with an integrated circuit, by means of the cylindrical spacer elements according to the invention, very good mechanical stability and resistance to shocks and vibrations are obtained, while still retaining excellent electrical properties, especially in terms of electrical losses within the semiconductor substrate of the integrated circuit.

Industrial Applications

The inductive components of the transformers according to the invention may have many applications, and especially in any circuit which includes oscillators, amplifiers or mixers, as well as in any active or passive filter. The inductive components may also be used by themselves, as a discrete component, where their high precision can be appreciated.

The association with integrated circuits is most particularly applicable in electronic circuits intended for telecommunication, microwave and radiofrequency processing.

What is claimed is:

1. An inductor assembly suitable for use in radiofrequency and microwave circuits that includes:
    a substrate,
    an inductor having an end terminal and being formed of a first metal strip that is wound in a spiral and being mounted upon a flat surface of said substrate,
    said substrate being formed of quartz,
    said spiral wound metal inductor being formed of copper;
    said first metal strip having a height equal to or greater than 10 microns; and raised spacer elements for mounting said end terminals of the inductor upon an integrated circuit.

2. The assembly of claim 1 wherein said inductor has a rectangular cross-section and a uniform height of about 30 microns above the flat surface of the substrate.

3. The assembly of claim 2 wherein faces of said inductor exposed to atmosphere are coated with a layer of gold.

4. The assembly of claim 2 wherein a space is provided between adjacent winding of said spiral wound first metal strip.

5. The assembly of claim 1 that further includes a polyimide layer mounted upon the flat surface of said substrate between said substrate and said first metal strip.

6. The assembly of claim 5 that further includes a first end terminal connected to an outer end of said inductor and a second end terminal connected to an inner end of said inductor by an elongated connector segment that passes through said polyimide layer.

7. The assembly of claim 1 wherein said spiral is circular in form.

8. The assembly of claim 1 wherein said integrated circuit board includes contact pads to which said raised spacer elements are connected to provide an electrical connection between said inductor terminals and said board.

9. The assembly of claim 8 wherein said spacer elements are cylindrical in form.

10. The assembly of claim 9 wherein the diameter of said spacer elements are about equal to three times the height of said spacer elements.

* * * * *